(12) United States Patent
Hoefer et al.

(10) Patent No.: US 11,505,455 B2
(45) Date of Patent: Nov. 22, 2022

(54) METHOD FOR PRODUCING A MICROMECHANICAL DEVICE HAVING A DAMPER STRUCTURE

(71) Applicant: Robert Bosch GmbH, Stuttgart (DE)

(72) Inventors: Holger Hoefer, Juelich (DE); Klaus Offterdinger, Stuttgart (DE); Maximilian Amberger, Karlsruhe (DE); Michael Stumber, Korntal-Muenchingen (DE)

(73) Assignee: Robert Bosch GmbH, Stuttgart (DE)

( * ) Notice: Subject to any disclaimer, the term of this patent is extended or adjusted under 35 U.S.C. 154(b) by 30 days.

(21) Appl. No.: 17/272,238

(22) PCT Filed: Nov. 29, 2019

(86) PCT No.: PCT/EP2019/083142
§ 371 (c)(1),
(2) Date: Feb. 26, 2021

(87) PCT Pub. No.: WO2020/126415
PCT Pub. Date: Jun. 25, 2020

(65) Prior Publication Data
US 2021/0179422 A1 Jun. 17, 2021

(30) Foreign Application Priority Data

Dec. 20, 2018 (DE) .......................... 102018222685.7

(51) Int. Cl.
*B81C 1/00* (2006.01)
*B81B 7/00* (2006.01)
*B81B 7/02* (2006.01)

(52) U.S. Cl.
CPC ........ *B81C 1/00269* (2013.01); *B81B 7/0016* (2013.01); *B81B 7/02* (2013.01);
(Continued)

(58) Field of Classification Search
None
See application file for complete search history.

(56) References Cited

U.S. PATENT DOCUMENTS

2004/0200368 A1* 10/2004 Ogino .................. B81C 1/0046
101/34
2007/0110962 A1* 5/2007 Tien ...................... B81C 1/0046
428/156

(Continued)

FOREIGN PATENT DOCUMENTS

DE 102006002350 A1 7/2007
DE 102006011753 A1 9/2007
(Continued)

OTHER PUBLICATIONS

International Search Report for PCT/EP2019/083142, dated Feb. 17, 2020.

*Primary Examiner* — Benjamin P Sandvik
(74) *Attorney, Agent, or Firm* — Norton Rose Fulbright US LLP; Gerard Messina

(57) ABSTRACT

A method for producing a micromechanical device having a damper structure. The method includes: (A) providing a micromechanical wafer having a rear side; (B) applying a liquid damper material onto the rear side; (C) pressing a matrix against the rear side in order to form at least one damper structure in the damper material; (D) curing the damper material; and (E) removing the matrix.

10 Claims, 4 Drawing Sheets

(52) U.S. Cl.
CPC ..... *B81B 7/0038* (2013.01); *B81B 2201/0228* (2013.01); *B81C 2201/0187* (2013.01); *B81C 2203/0118* (2013.01)

(56) References Cited

U.S. PATENT DOCUMENTS

| | | | | |
|---|---|---|---|---|
| 2010/0192689 | A1* | 8/2010 | Ulm | B81B 7/0012 |
| | | | | 73/430 |
| 2012/0034390 | A1* | 2/2012 | Suh | B81C 1/0046 |
| | | | | 427/510 |
| 2018/0244515 | A1* | 8/2018 | Rombach | H01L 24/34 |
| 2021/0323810 | A1* | 10/2021 | Stumber | B81C 1/00484 |
| 2022/0024757 | A1* | 1/2022 | Stumber | B81C 1/00825 |

FOREIGN PATENT DOCUMENTS

| | | |
|---|---|---|
| DE | 102006026878 A1 | 12/2007 |
| DE | 102009000574 A1 | 8/2010 |

* cited by examiner

—300

—200
—300

—100
—130
—300

—120
—100
—130
—210

METHOD FOR PRODUCING A MICROMECHANICAL DEVICE HAVING A DAMPER STRUCTURE

FIELD

The present invention relates to a method for producing a micromechanical device having a damper structure.

BACKGROUND INFORMATION

Yaw rate sensors for electronic stability programs for automobiles, which are known as ESPs, are currently often accommodated in a control unit in the engine compartment. This results in a greater need for better vibration damping and also a reduction of thermal as well as packaging-induced voltage loads for the micromechanical sensors. The demands have increased even further by the development of highly automated driving inasmuch as the sensor accuracy and a fault-free functioning are of paramount importance in this case.

The current approaches for vibration damping relate to the fully assembled and packaged (encapsulated) chip and dampen the entire composite made up of the yaw rate sensor, the acceleration sensor and the evaluation circuit (ASIC). However, damping is required above all in the case of yaw rate sensors. One solution in the related art already satisfies this requirement in that the sensor chip is bonded to a damper structure made from silicon, for example. The handling during the mounting and positioning of the soft damper elements as well as the subsequent bonding and electrical contacting (wire bonding) of the sensor chips is very challenging.

SUMMARY

It is an object of the present invention to provide a simpler and also more economical method for producing smaller damper structures.

The present invention relates to a method for producing a micromechanical device having a damper structure. In accordance with an example embodiment of the present invention, the method includes the following steps:
(A) Providing a micromechanical wafer having a rear side;
(B) Applying a liquid damper material onto the rear side;
(C) Pressing a matrix against the rear side in order to form at least one damper structure in the damper material;
(D) Curing the damper material;
(E) Removing the matrix.

One advantageous example embodiment of the method according to the present invention provides that prior to step (B), liquid damper material is applied to the matrix, and that step (B) and (C) are then carried out simultaneously by placing and pressing the matrix against the rear side. In an advantageous manner, the required quantity of damper material can be controlled quite well in this way. It is also advantageous that a matrix which is covered or coated with a release agent or is made from a release material is used, which is easily separable from the damper material. In this way, the matrix is easily and cleanly removable to allow for a rapid and uncomplicated reuse.

It is also advantageous that the damper material is applied in structured form in step (B), in particular by dispensing, screen printing or stencil printing. In an advantageous manner, damper material is applied in particular only in the regions of the subsequent dampers so that the quantity of excess damper material is able to be reduced during the production. It is advantageous to singularize the micromechanical wafer into individual chips after step (E). In an advantageous manner, the damper structure is then already applied in a simple and precise manner for all chips.

In comparison with the related art in the field of vibration decoupling as described in German Patent Application Nos. DE 102006002350 and DE 102006026878 A1, for instance, the present invention provides a compact, simple structure for decoupling mechanical vibrations, which results in a great potential for cost savings.

It is possible to selectively dampen only the particular MEMS sensors that are actually disturbed by vibrations. For example, in an inertial sensor for the measurement of six degrees of freedom, an acceleration sensor does not require additional damping or the damping may even have a negative effect, while a yaw rate sensor exhibits a significantly enhanced performance or a lower interference susceptibility by a damping structure. The production method according to the present invention has the following distinct advantages:

It allows for a simple application of the damper structures directly at the wafer level, that is to say, for thousands of chips all at once, prior to the singularization (sawing). This also enables a simultaneous optimal positioning of dampers and chips relative to one another without a difficult adjustment for each individual chip. Even small tolerances during the assembly lead to asymmetries/imbalances in the vibration and damping behavior.

There is no bonding process for the connection between the damper structure and the chip in the method according to the present invention. Instead, a direct, satisfactory connection is produced. Because of the omitted bonding step, a compact structure having a low height (only an additional 100-300 μm) is possible. The method according to the present invention therefore offers a clear size reduction of the damper structure and a lower costs as a result of the simpler structure and the omission of complex intermediate steps.

In addition, the provided design variant also has a stress-reducing effect on mechanical stresses in micromechanical yaw rate sensors. The damper not only dampens vibrations and shocks but also decouples the chip from mechanical stresses of the assembled sublayer, e.g., a circuit board or some other substrate made from a ceramic material, for example.

DETAILED DESCRIPTION OF EXAMPLE EMBODIMENT

Figure 1:
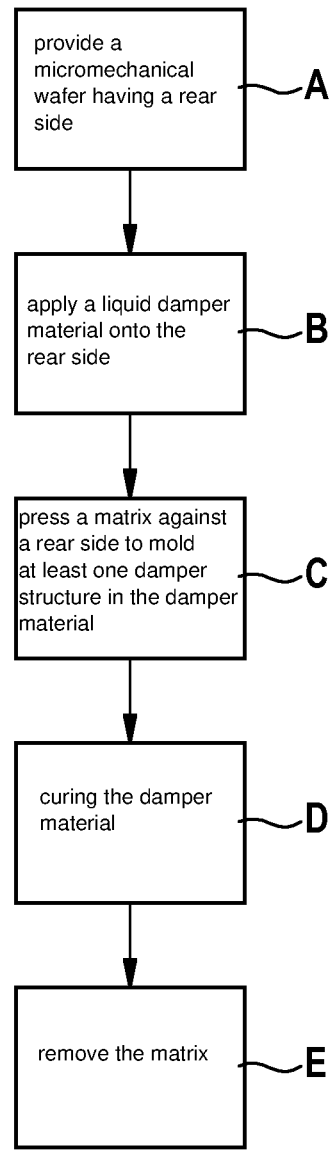
FIG. 1 schematically illustrates, in the form of a flow diagram, a method according to an example embodiment of the present invention for the production of a micromechanical device having damper structures.

First, a micromechanical wafer, in particular a sensor wafer, is produced in the usual manner and encapsulated by a cap wafer. Prior to singularizing the wafers into individual sensors (usually by sawing), the production of the damper structures is carried out directly at the wafer level. For example, the damper structures may be made from a curing silicon or PDMS (e.g., Dow Corning Sylguard 184®), for example. It is mixed according to the manufacturer specifications, degassed and then applied in the required quantity to the rear side of the wafer, e.g., by dispensing, with the option of already prestructuring the damper structure so that not as much material has to be displaced during a following molding process. The damper material may also be applied by screen printing/stencil printing. Here, too, the structure could be prestructured in order not to displace too much material. In addition, the damper material can also be applied by throwing, in particular when the material has a thin, highly liquid consistency. Next, a stencil/damper mold for molding the damper structures for all sensor chips is pressed onto the wafer (or rolled on from the side, if flexible). Attention must be paid to the precise positioning of this matrix. The silicon is then cured (e.g., by an adapted temperature profile in the case of Sylguard 184). The stencil/damper mold is then able to be pulled off. It may be advantageous in this context if the stencil is flexible and can be rolled back.

In an advantageous manner, the stencil/damper mold is treated with a release agent or coated with a corresponding layer or is made directly from a material that is easily separable again from the damper material (such as PTFE). Ideally, the stencil/damper mold may advantageously be used for another molding process on a further wafer, possibly after a cleaning process or a further treatment with a release agent. The rear side of the wafer, which is to be permanently connected to the damper material, may also be pretreated, e.g., by a brief O2 plasma or a plasma polymerization of adhesive layers.

It may be advantageous (but often not necessary) for the rear side of the wafer on which the damper structures are molded/applied to be structured as well in order to offer better anchoring to the material of the dampers during the molding process and to produce an even more robust connection between the sensor chip and the damper.

One possible alternative would also be the insertion of the entire wafer or a large part of the wafer (such as a quarter or one-sixth) in an injection molding system and the application of the damper structures on the underside by injection molding of a corresponding silicon that features the desired Shore hardness. In the process it must be ensured that the electrical contact surfaces for the later bonding are not contaminated and that the occurring thermal and mechanical loading during the injection molding process does not damage the wafer. The method then includes the following steps:

Providing a micromechanical wafer having a rear side;
Introducing the wafer into an injection molding tool for molding at least one damper structure in the damper material;
Injecting a liquid damper material into the mold and onto the rear side;
Curing the damper material;
Opening the mold and removing the wafer with the connected damper structure.

FIG. 1 schematically illustrates, in the form of a flow diagram, a method according to an example embodiment of the present invention for producing a micromechanical device having damper structures. The method according to the example embodiment of the present invention includes at least the following steps:
(A) Providing a micromechanical wafer having a rear side;
(B) Applying a liquid damper material onto the rear side;
(C) Pressing a matrix against the rear side in order to mold at least one damper structure in the damper material;
(D) Curing the damper material;
(E) Removing the matrix.

A wafer also includes wafer pieces. It may be advantageous to divide the wafer into wafer pieces prior to its supply, e.g., to divide it into quarters. This may be advantageous particularly in the case of large wafers. The wafer pieces are often easier to handle. A wafer piece always still has a number of micromechanical structures for a considerable number of chips. A wafer piece takes up more than one-tenth of the surface of the wafer. The curing of the damper material is able to be achieved by heating (heat/baking) or also by UV radiation (UV-curing damper material). A UV-transparent matrix would be required in the latter case. After the matrix has been removed, the wafer or the wafer piece with the connected damper structures is able to be singularized in order to form individual chips such as by sawing.

Figure 2A:
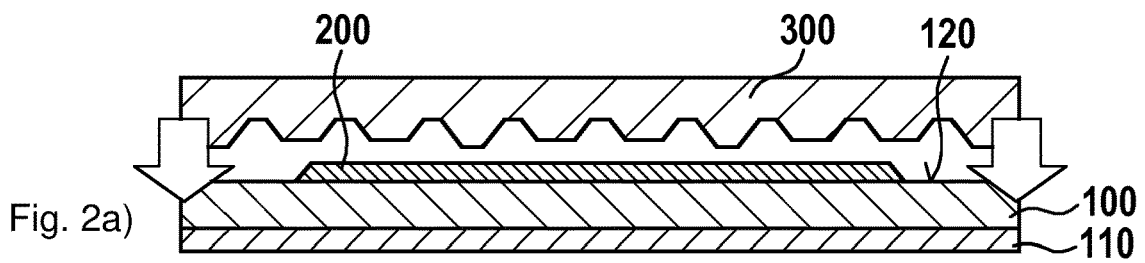
FIGS. 2a through 2c schematically illustrate the method according to the present invention in a first exemplary embodiment of a micromechanical device.
Figure 2B:
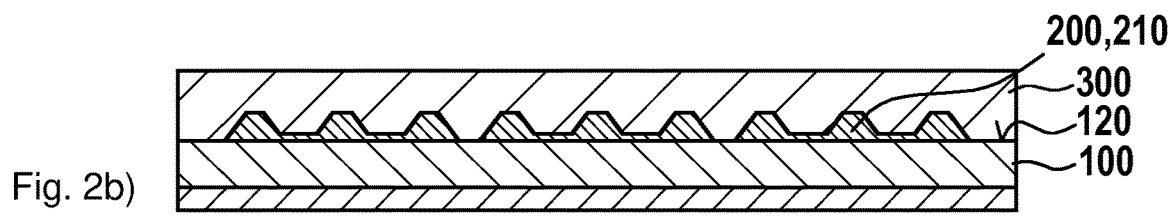
Figure 2C:
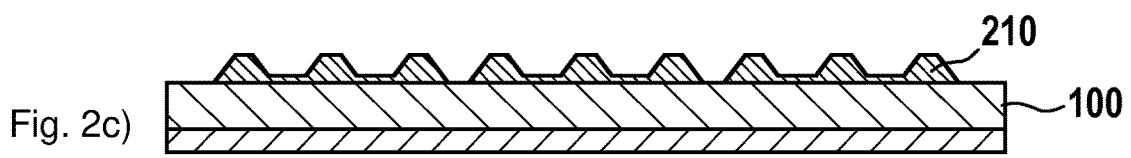

FIGS. 2a through 2c schematically illustrate the method of the present invention in a first exemplary embodiment of a micromechanical device. Shown in schematically simplified form is the molding process. FIG. 2a shows a micromechanical wafer 100, which is a sensor wafer in this case, which includes a cap 110. Micromechanical wafer 100 is provided with a rear side 120 pointing up. A liquid damper material 200 is applied at least regionally and evenly onto the rear side, for instance by dispensing. Next, a matrix 300, a damper master mold, is pressed against the rear side in the direction of the arrow. Air or gases is/are released and the negative form of the matrix is filled with the damper material. FIG. 2b shows micromechanical wafer 100 against whose rear side 120 matrix 300 is resting. The matrix has thereby molded damper material 200 into a damper structure 210. The composite is now heated and the damper material, which is silicon in this instance, hardens. The matrix is then removed. FIG. 2c shows micromechanical wafer 100 having damper structures 210 on the rear side. The damper structures are positively connected to the sensor wafer. The waver including the damper structures is now able to be singularized, i.e. into capped sensor chips provided with damper structures on the underside.

Figure 3A:
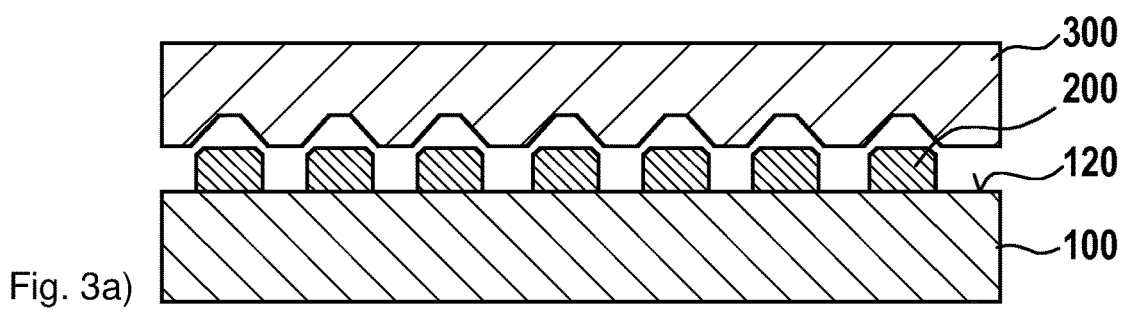
FIGS. 3a through 3c schematically illustrate the method according to the present invention in a second exemplary embodiment of a micromechanical device.
Figure 3B:
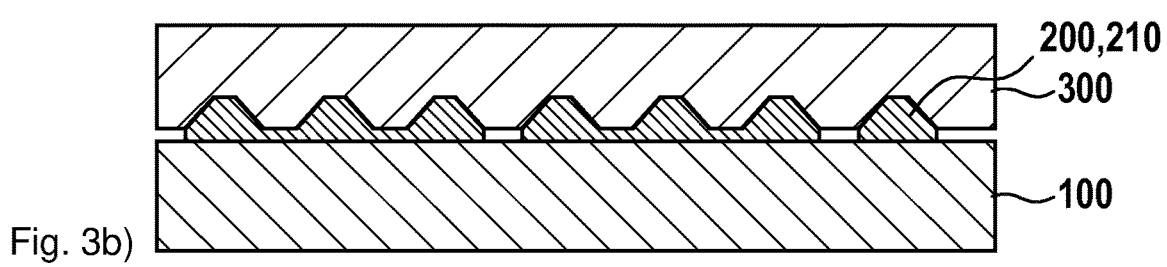
Figure 3C:
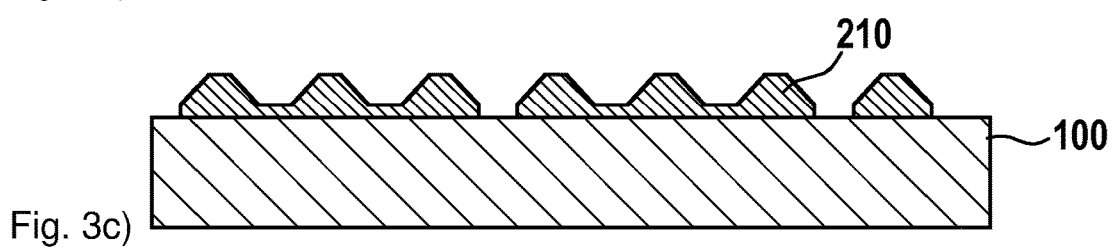

FIGS. 3a through 3c schematically illustrate the method according to the present invention in a second exemplary embodiment of a micromechanical device. FIG. 3a shows micromechanical wafer 100, which is provided with a rear side 120 pointing up. Prestructured damper material 200, which is silicon in this instance, is already situated on the rear side and has been applied in structured form by dispensing, or by screen or stencil printing. FIG. 3b shows micromechanical wafer 100 against whose rear side 120 matrix 300 is pressed. The matrix has thereby completely molded structured damper material 200 into a damper structure 210. The composite is now heated and the damper material hardens. The matrix is then removed. FIG. 3c shows micromechanical wafer 100 provided with damper structures 210 on the rear side.

Figure 4A:
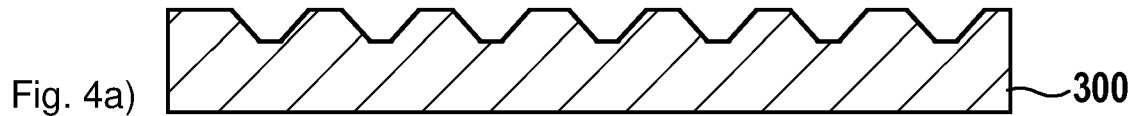
FIGS. 4a through 4d schematically illustrate the method according to the present invention in a third exemplary embodiment of a micromechanical device.
Figure 4B:
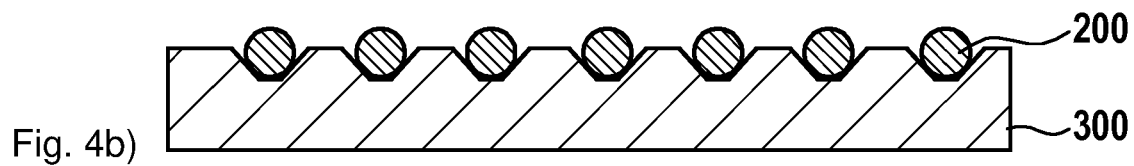
Figure 4C:
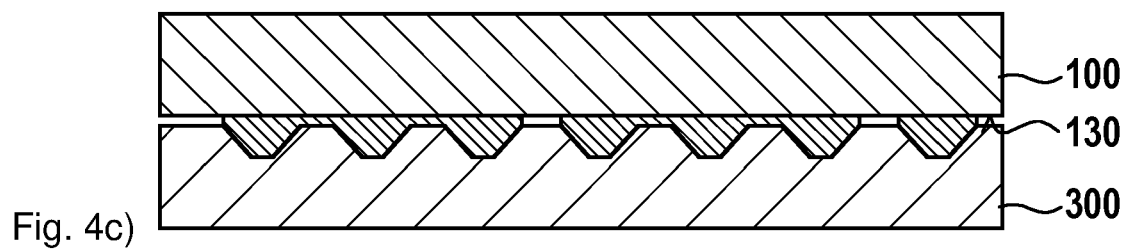
Figure 4D:
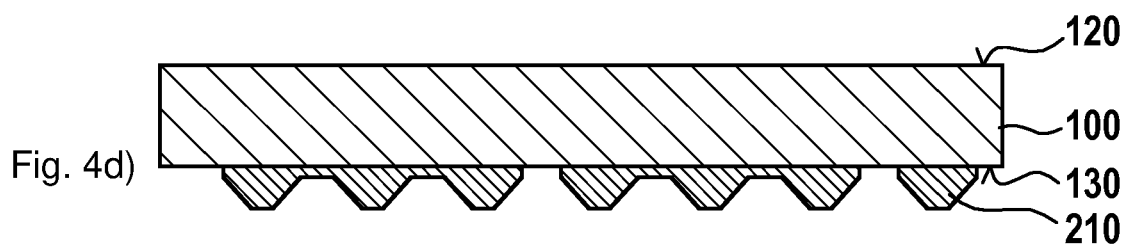

FIGS. 4a through 4d schematically show the method according to the present invention in a third exemplary embodiment of a micromechanical device. FIG. 4a shows matrix 300, which in this exemplary embodiment is provided lying on its back. Damper material 200 is dispensed or raked into depressions of the matrix, as illustrated in FIG. 4b. FIG. 4c shows how micromechanical wafer 100, which is a sensor in this case, is placed by its rear side on matrix 300 and pressed down. Air escapes, possibly under a vacuum, and the molds are filled with the damper material. Heating then takes place and the damper material, which is made of silicon here, cures. The matrix is then removed and the damper structures are positively connected to the sensor wafer, as illustrated in FIG. 4d. The entire structure is now able to be singularized into capped sensor chips including damper structures on the underside.

Figure 5:
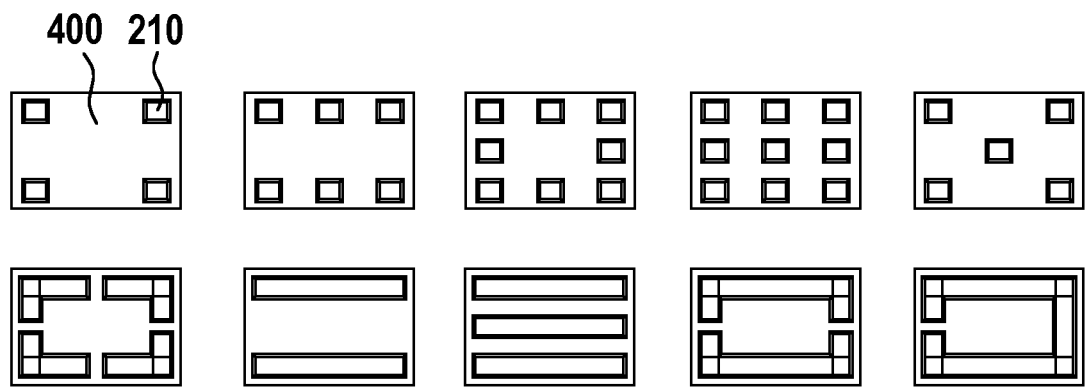
FIG. 5 shows a top view of possible damper structures that are able to be produced according to an example embodiment of the present invention.

By way of example, FIG. 5 shows a top view of possible damper structures that are able to be produced according to the present invention. Shown is a non-exhaustive selection of possible damper structures 210 on a chip 400 in each case.

Figure 6:
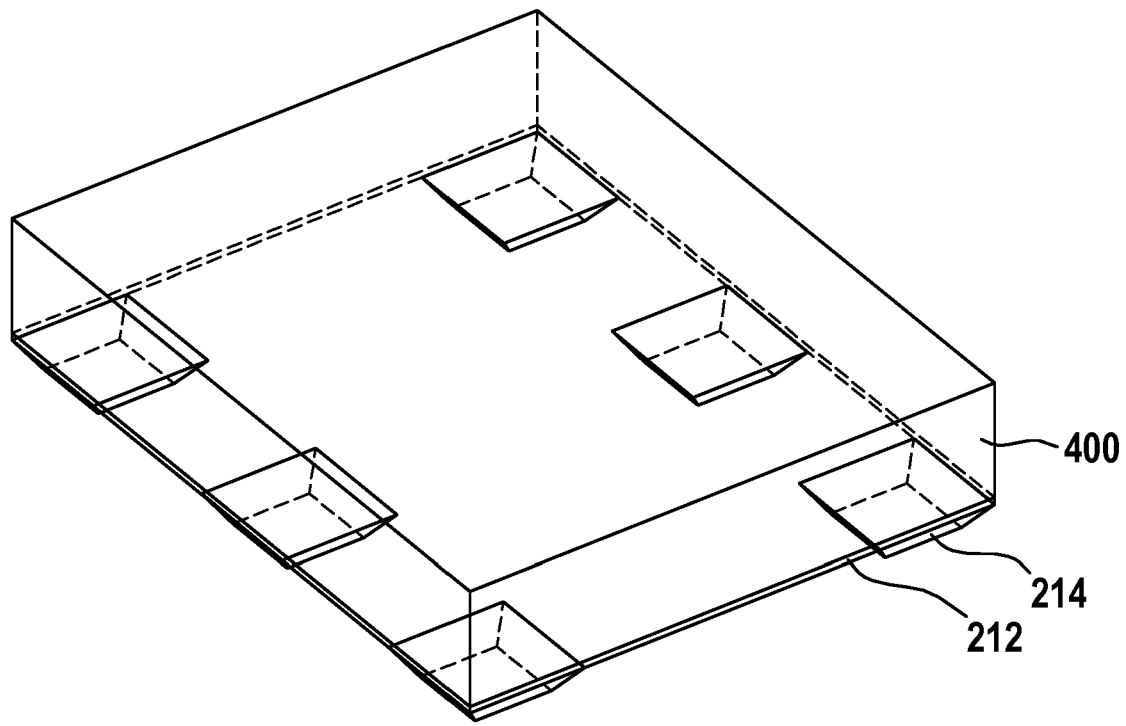
FIG. 6 shows a micromechanical chip having a damper structure in accordance with an example embodiment of the present invention.

FIG. 6 shows a micromechanical chip having a damper structure. Illustrated in transparent form is a chip 400. Situated underneath is damper structure 210, which is made up of an optional damper plate 212 and, in this case, six individual dampers 214. Damper plate 212 and dampers 214 have been produced in a single working step in the described method according to the present invention.

LIST OF REFERENCE NUMERALS 100 micromechanical wafer
110 cap
120 rear side
140 front side
200 damper material
210 damper structure
212 damper plate
214 damper
300 matrix
400 chip

What is claimed is:

1. A method for producing a micromechanical device having a damper structure, the method comprising:
   (A) providing a micromechanical wafer having a rear side;
   (B) applying a liquid damper material onto the rear side;
   (C) pressing a matrix against the rear side to form at least one damper structure in the damper material;
   (D) curing the damper material; and
   (E) removing the matrix;
   wherein prior to the step (B), liquid damper material is applied to the matrix, whereupon steps (B) and (C) are carried out simultaneously by placing and pressing the matrix against the rear side.

2. The method of claim 1, wherein the matrix is covered or coated with a release agent or is made from a release agent which is easily separable from the damper material.

3. The method of claim 1, wherein in step (B), the damper material is applied in structured form by dispensing, or screen printing or stencil printing.

4. The method of claim 1, wherein in step (D), the curing of the damper material is induced by baking, and/or by UV radiation.

5. The method of claim 1, wherein after step (E), the micromechanical wafer is singularized into individual chips in a step (F).

6. The method of claim 1, wherein the matrix is covered or coated with a release agent or is made from a release agent which is easily separable from the damper material, and wherein in step (B), the damper material is applied in structured form by dispensing, or screen printing or stencil printing.

7. The method of claim 6, wherein in step (D), the curing of the damper material is induced by baking, and/or by UV radiation.

8. The method of claim 6, wherein after step (E), the micromechanical wafer is singularized into individual chips in a step (F).

9. The method of claim 6, wherein in step (D), the curing of the damper material is induced by baking, and/or by UV radiation, and wherein after step (E), the micromechanical wafer is singularized into individual chips in a step (F).

10. The method of claim 1, wherein in step (D), the curing of the damper material is induced by baking, and/or by UV radiation, and wherein after step (E), the micromechanical wafer is singularized into individual chips in a step (F).

* * * * *